Nov. 26, 1963 P. J. SPETH 3,112,376

ELECTRICAL APPARATUS

Filed Oct. 29, 1958 2 Sheets-Sheet 1

INVENTOR.
PETER J. SPETH

BY Bauer and Seymour
ATTORNEYS

ELECTRICAL APPARATUS

Filed Oct. 29, 1958 2 Sheets-Sheet 2

INVENTOR.
PETER J. SPETH
BY Bauer and Seymour
ATTORNEYS

United States Patent Office 3,112,376

Patented Nov. 26, 1963

3,112,376

ELECTRICAL APPARATUS

Peter J. Speth, 239—25 88th Ave., Bellerose 26, N.Y.

Filed Oct. 29, 1958, Ser. No. 770,500
41 Claims. (Cl. 179—170)

This invention relates to electrical apparatus and more particularly to methods for amplifying electrical signals or impulses in transmission lines or the like and to circuitry and apparatus for practicing said methods.

One of the objects of the present invention is to provide novel methods and circuitry whereby electrical signals or impulses may be magnified or amplified.

Another object of the invention is to provide a novel method for amplifying or magnifying electrical signals or impulses in a transmission line or the like.

Still another object is to provide novel simplified circuitry and apparatus whereby electrical signals or impulses in a line may be amplified or boosted in a novel manner.

Still another object is to provide novel means for coupling electronic amplifier means to leads carrying input and output signals to and from the amplifier means to attain amplification of signals originating in said leads from either side of the coupling thereof to the amplifier means.

Still another object is to provide electrical circuitry whereby transmission lines or the like, such as telephone lines, may be coupled in a novel manner with means for amplifying the electrical signal in the line.

A further object is to provide novel circuitry and apparatus of the above type whereby substantially in-phase amplification of electrical signals may be attained efficiently and with negligible or no wave form distortion.

A still further object is to provide a novel system for amplifying electrical impulses or signals in a two-wire transmission line or the like whereby the same amplifier means serves through the same connections to amplify signals transmitted in either direction in the line, thus making it more feasible to provide long distance two-way, two-wire communication over telephone lines and the like.

Another object is to provide a novelly constructed two-way, two-wire line amplifier system for electrical signals in the line.

Another object is to provide a novel electronic amplifier system, the novel features of which adapt it for use either as a line bridging amplifier for in-phase boost of any signal in the line or as a through amplifier series connected in the line.

Another object is to provide novelly constructed electronic amplifier means wherein the same two wires carry the input signals as well as the amplified output signals.

A further object is to provide a novel electronic amplifier circuit which is free from wave form type of distortion that is inherent in amplifiers of the closed bridge, hybrid coil type now in use in telephone circuits, thus making feasible the use of a plurality of amplifiers as repeaters at spaced intervals in long two-wire, two-way circuits without the accumulated distortions which would be experienced if known repeater systems were used.

Another object is to provide a novel electronic amplifier system which is economical and efficient and which has excellent gain and linearity characteristics and reliable circuit stability.

Another object of the invention is to provide novel methods and means for amplifying electrical signals which are readily adaptable to a wide range of frequencies and a wide range of gain requirements and in which a variety of different types of components and arrangements of components may be used for the same function to suit a variety of uses.

Another object is to provide an amplifier system of the above character wherein positive feed-back of part of the amplified signal may be employed in re-enforcing the original input signal and thereby increase the amplification or gain beyond that heretofore attainable with comparable apparatus.

A still further object of the invention is to provide novel circuitry which is very simple in nature for effectively cancelling out or nullifying the effect of all or a predetermined portion of the output signal across the input transformer of an amplifier wherein an amplified output signal is fed into the same circuit in which the input signal originates.

Another object of the invention is to provide novel electronic amplifier means wherein the amplifier output signal is fed into the signal input circuit through novel circuitry whereby the incoming signal which controls the amplifier is not appreciably or adversely affected by the output signal.

A further object is to provide novel electronic amplifier means of the above character wherein the means for cancelling or nullifying the effect of the output signal on the input to the amplifier is effective to prevent oscillation or singing of the amplifier when the input line is open.

The above and further objects and novel features of the invention will more fully appear from the following detail description when the same is read in connection with the accompanying drawings. It is to be expressly understood, however, that the drawings are for the purpose of illustration only and are not intended as a definition of the limits of the invention.

In the drawings, wherein like reference characters refer to like parts throughout the several views, FIG. 1 is a diagrammatic representation of novel circuitry embodying one form of the invention;

Figure 1:
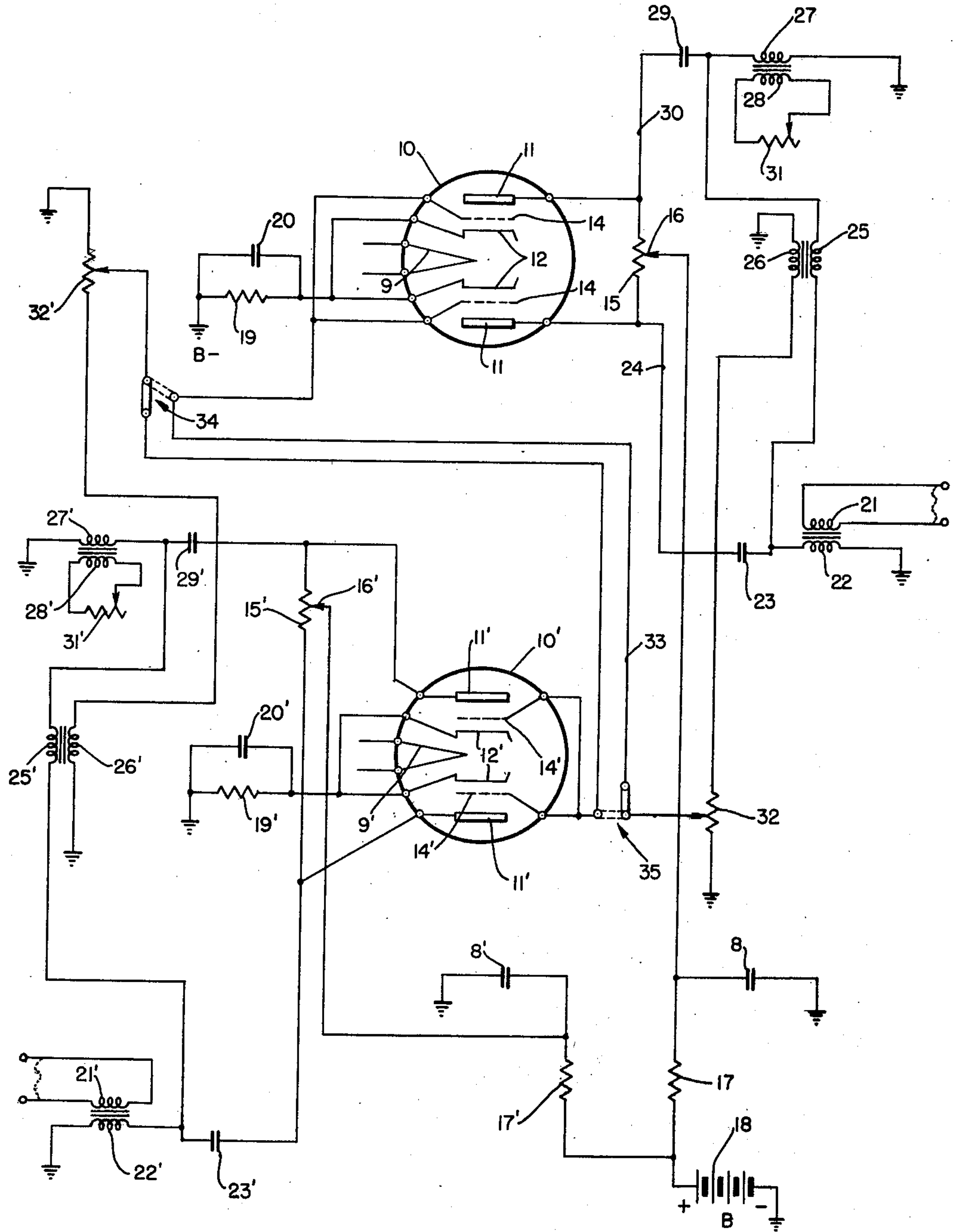

In a broad or generic sense, the invention comprehends the novel combination of three electrical circuits, and in a more specific sense, it comprehends adaptations of various embodiments of said novel combination of circuits to electronic amplification systems. Basically, the first and second circuits, which may be called signal input and balancing circuits, may be supplied with electrical signals by a common source of electrical energy, and the third circuit, which may be called the amplifier input circuit, is operatively coupled to both said signal input and balancing circuits to receive signal energy from a second source through at least a part of the signal input circuit and said coupling. The latter and the relation of the signal input and balancing circuits to each other are such that the normal effect on the amplifier input circuit by the signals generated in the signal input circuit by said common source may be wholly or selectively partially cancelled or balanced out by the corresponding signals generated in the balancing circuit by said common source.

A limited number of embodiments of the invention are diagrammatically illustrated in the drawings, by way of example, in the form of electronic amplifier systems adapted for a multiplicity of specific uses. In the interest of simplicity, however, the same will be hereinafter described primarily in relation to the manner of use thereof in telephone or other two-way communication systems. In one adaptation, the present invention contemplates the replacement of so-called repeaters in communication lines, such repeaters of the so-called hybrid coil type and other types now in use, with a greatly simplified, more reliable and more economical system of amplification which will provide desired amplifier gains on a linear frequency response basis and without distortion in a manner that is far superior to any previously known systems. The systems contemplated function to provide a substantially constant or linear gain over a wide range of signal frequencies. In each of the illustrated embodiments, the signal to be amplified may be fed to the amplifier, which may be of any known construction, from the same circuit or terminals to which the amplified signal is delivered substantially in phase with the original signal, thereby making possible in an efficient and satisfactory manner the amplification by a single amplifier of signals travelling in either direction, that is, signals of either polarity, in a two-wire communication system. In each embodiment, dual, novelly associated paths or circuits are provided for equally or selectively unequally dividing or receiving the amplified signal produced in an amplifier. At least a part of one of said paths or circuits serves as the circuit for the input signal and the relationship of said paths or circuits is such that the input signal is substantially isolated in but one of said circuits while the output or amplified signal in one said circuit is utilized to partially or wholly cancel the feed-back effect of the amplified signal in the other of the dual circuits.

The embodiment of the invention illustrated in FIG. 1 includes novel amplifier means inductively coupled or connected with a load or input line in which the signal to be amplified originates, said means being capable of feeding the amplified signal into the same or input line in a desirable and satisfactory manner. Said means are also capable of being inductively so connected in a two-wire, two-way transmission line as to receive signals from either direction and transmit corresponding amplified signals in the same direction. The novel amplifier means shown makes it possible during normal operation thereof to utilize a predetermined and controllable feed-back of the amplified signal to the amplifier input if desired, but without the necessity therefor if such is not desired.

We shall consider first that portion of FIG. 1 comprising a single parallel feed electronic amplifier tube 10 which may be of the type commonly sold as Type 6SL7G. Other comparable types of amplifier means may also be used. Tube 10 comprises a dual set of elements, each set including a plate 11, a cathode 12 and a grid 14. A heating element 9 is connected in a known manner (not shown) to a suitable source of electrical energy. The plates 11, 11 are connected in parallel through opposed end portions of a resistance 15, a contact 16, which is preferably adjustable along the resistance, and an isolation resistance 17 to the positive terminal of any suitable source of electrical energy which may be a battery 18. For maintaining the supply of direct current constant, a damping condenser 8 may be connected as shown. The connection at 16 is provided for balancing purposes to effect substantially equal amplification by both halves of tube 10. Variations in the resistance 15 in circuit with each plate element 11, varies the plate voltage and hence, the amplification. This balancing effect may be attained in other known ways.

The cathodes 12, 12 of tube 10 are also connected in parallel in accordance with known practice through a resistance 19 to ground, said resistance being shunted by a by-pass condenser 20. The ground connection is equivalent to the negative terminal of a source of electrical energy, such as the battery 18. The normal bias of grids 14, 14 is determined by the voltage drop across resistance 19 and is preferably such as to permit tube 10 to be conductive at all times during normal operation.

When a single tube 10 is employed to amplify the signal originating in a two-wire line, the winding 21 of a transformer 21, 22 is connected in or across said line so that the signal to be amplified is induced into winding 22 which is connected or coupled in a novel manner to the amplifier means above described whereby an amplified signal is supplied to the signal input line without affecting the line signal input to the amplifier means, except when some feed-back is desired and intentionally provided. In the form shown, one terminal of winding 22 is connected to ground and the other terminal is connected to one end of resistor 15 through a condenser 23 and a lead 24 and also to one terminal of the primary winding 25 of the amplifier input transformer 25, 26. The primary winding 27 of a balance transformer 27, 28 has one terminal connected to ground and, similarly to winding 22, has its other terminal connected to the other end of resistor 15 through a condenser 29 and a lead 30 and also to the other end of primary winding 25. Condensers 23 and 29 serve to isolate battery 18 from any connection to ground through windings 22 and 27. A balance circuit comprising secondary winding 28 inductively coupled with winding 27 and a variable resistance 31 or other suitable load is designed, for reasons which will more fully appear as the description proceeds, to balance the load in the signal input line comprising winding 21. Resistance 31 is exemplary only and may, if desired, consist of a load circuit in which practical use may be made of the energy supplied thereto.

The secondary winding 26 of the input transformer is shown connected to ground at one end and to grids 14, 14 in parallel through a part of a variable gain control resistance 32 and a lead 33 when switches 34 and 35 are in their full line positions as illustrated. Thus, any signal originating in the signal input line in or across which winding 21 is connected will be introduced by induction into winding 22. Windings 25 and 27 being connected in series across winding 22, any signal voltage thus induced across the latter will create an alternating current signal in windings 25 and 27. The construction is such that the major voltage drop is across winding 25. A corresponding signal is thus induced into winding 26 and varies the bias on grids 14, 14 in accordance with the variations or fluctuations of the input signal. This, in turn, varies the conductivity of both halves of tube 10 equally and hence, varies the flow of energy in the circuits of plates 11, 11 in a like manner.

As long as the output of battery 18 or other suitable source of electrical energy through the plate circuits is steady and non-fluctuating, direct current flow from the battery to windings 22 and 27 will be blocked by condensers 23 and 29. When, however, the flow in the plate circuits varies or fluctuates, as a result of the grid bias varying or fluctuating in the manner explained above, when an incoming variable or fluctuating signal is applied to the grids 14, 14, the alternating current component thereof passes condensers 23 and 29 and flows to ground through windings 22 and 27. The circuit constants may be so designed or adjusted, such as by means of variable resistance 31, that the fluctuating or A.C. voltage will be equal, in phase and of like polarity at opposite terminals of primary winding 25 of the signal input transformer. Thus, the output of the amplifier may, in effect, be equally divided or balanced between the operating or input line comprising winding 21 and the balancing load or line comprising winding 28 to thereby balance the effects of the amplifier output signals on the input transformer or, in other words, to thereby isolate the input transformer 25, 26 from the effects of the amplifier output signals. An amplified signal which is substantially in phase with and of greater amplitude than the input signal is accordingly induced into the signal input line through transformer 22, 21 without affecting the incoming signal which was impressed across winding 25 for the purpose above described.

If it is desired to further increase the amplification which normally results from applying the available incoming signal to the grids 14, 14 in the manner described above, a controlled or predetermined feed-back of the output signal through transformer 25, 26 may be effected by adjusting the components of the circuits to create an unbalanced or unequal division of the output signal to windings 22 and 27. This causes a portion of the output signal to pass through winding 25 so as to provide positive feed-back of the output signal. If desired, the adjustment may be made in the other direction so that the polarity of that portion of the output signal impressed across winding 25 will provide negative feed-back of the output signal. These adjustments may be accomplished by suitably varying the resistance 31 or otherwise suitably unbalancing the output voltage at opposed ends of winding 25. Thus, the output signals in circuits embodying transformers 22, 21 and 27, 28 may wholly or partially balance the effects of each other across input transformer 25, 26 while an incoming signal is fed through transformer 21, 22 into transformer 25, 26.

When the circuit through winding 21 is closed and a fluctuating direct current or alternating current signal is impressed thereon, a corresponding signal is induced across winding 22 and hence, through windings 25 and 27. A corresponding signal is thereby induced in secondary winding 26 of the amplifier input transformer and impressed equally upon the parallel connected grids 14, 14 through gain control resistance 32 and lead 33. The bias on the grids is thus varied as the amplitude of the input signal varies and causes a corresponding variation in the flow of energy from battery 18 in the plate circuits of tube 10 and hence, through the parallel connected circuits comprising condensers 23 and 29 and the transformer windings 22 and 27. If these parallel circuits, together with the load circuits coupled thereto through windings 21 and 28 are balanced, there will be no flow of output energy through the primary winding 25 of the input transformer and hence, no feed-back to the amplifier and no interference with the incoming signal which is to be amplified. The energy from battery 18 or a comparable source may be greater than the original or incoming signal so that an amplified signal substantially in phase with the original incoming signal is returned to the input line through transformer 22, 21.

When the incoming signal is discontinued, such as when the circuit including winding 21 is opened, there will be no flow through winding 25 and hence, no tendency of the tube 10 to oscillate or sing. Any number of the above described amplifier systems may accordingly be connected across a long two-wire telephone line or the like at desired intervals to amplify signals transmitted by the line in either direction without the necessity for using so-called hybrid coils of the type now used at the terminals of four-wire telephone lines. Such an amplifying system provides excellent amplification without appreciable distortion and is adaptable to a wide range of frequencies including audio, radio and carrier frequencies.

In the lower part of FIG. 1 there is illustrated a second amplifying system which is identical with the first system above described and is connected to the same power source 18 although a separate source may be used. The corresponding parts of the two systems are identified by the same numerals, a prime (′) being added to distinguish the numerals for the second system. Each of the two systems may be used separately for returning an amplified signal to its input line as described above, or the two may be connected back-to-back by moving switches 34 and 35 to their dotted line positions thereby connecting the input transformer 25, 26 to grids 14′, 14′ and the input transformer 25′, 26′ to the grids 14, 14. Thus, a signal originating in winding 21 will be amplified through the operation of the second system embodying tube 10′ and transmitted into another line through winding 21′. Likewise, a signal originating in winding 21′ will be amplified by the system embodying tube 10 and transmitted into the line embodying winding 21. Two systems thus connected back-to-back may accordingly be inserted into a two-wire telephone line or the like for two-way communication with separate gain adjustments for each direction of the line.

The various components of the amplifier systems above described will, of course, vary for different uses, such as for the purposes of accommodating different frequencies, voltages, amplification requirements and the like. In one satisfactorily operable system adapted to audio frequencies, the following elements of the system had the indicated values:

| | |
|---|---|
| Resistor 15 | 100,000 ohms. |
| Resistor 17 | 18,000 ohms. |
| Battery 18 | 250 volts. |
| Resistance 19 | 300 ohms. |
| Condenser 20 | 20 mf., 50 volts. |
| Transformer windings 21, 25 and 28 | 600 ohms impedance. |
| Transformer windings 22, 26 and 27 | 6,000 ohms impedance. |
| Condensers 23 and 29 | 0.5 mf. |
| Resistor 31 | 600 ohms. |
| Resistance 32 | 500,000 ohms. |

Figures 2, 3, 4:
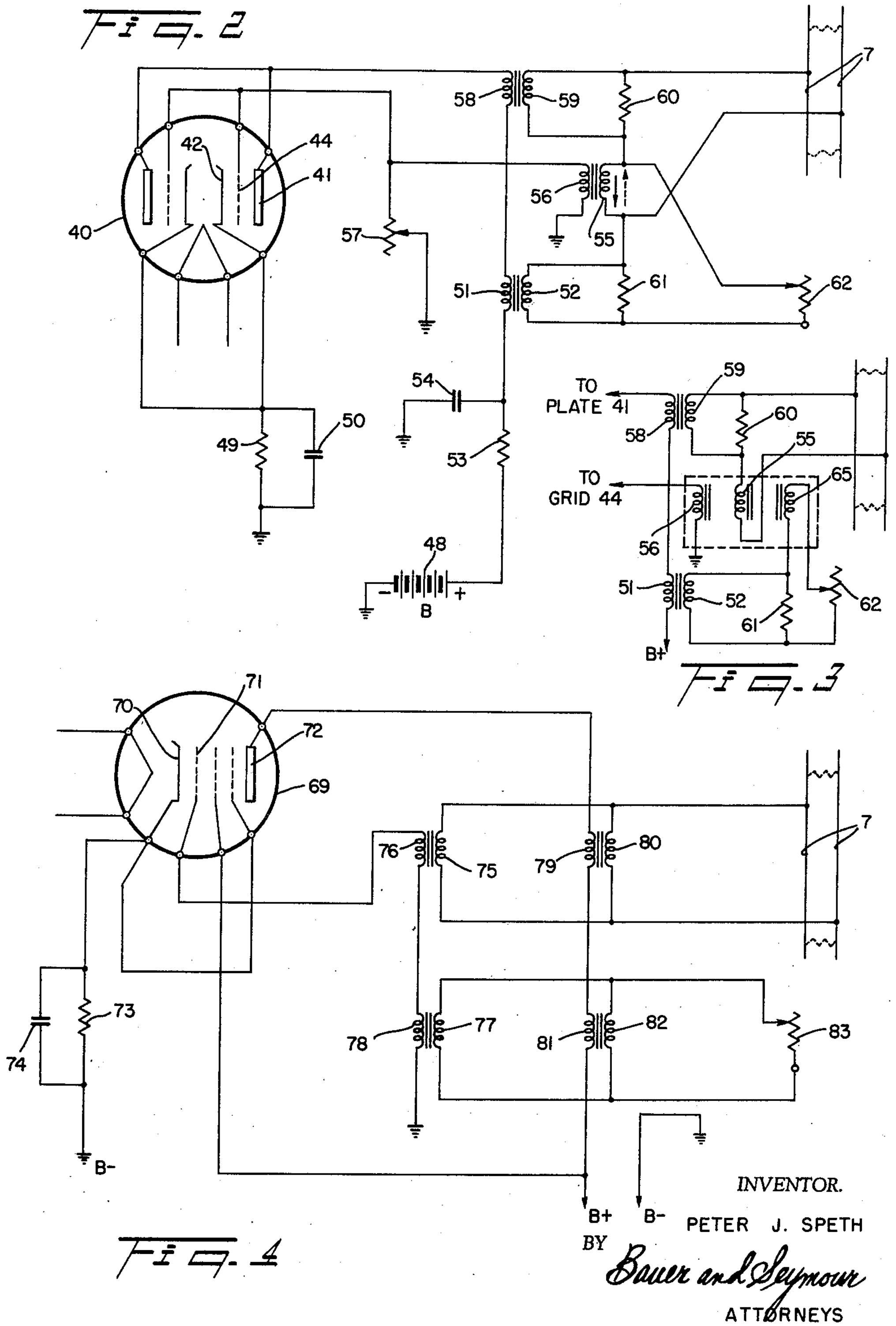
FIG. 2 is a similar representation of another form of the invention.
FIG. 3 is a detail view showing a modification of a part of the circuitry of FIG. 2.
FIG. 4 diagrammatically illustrates a further embodiment.

Another practical and efficient embodiment of the invention as illustrated in FIG. 2 permits the use of a single vacuum tube or comparable device, as distinguished from the double or dual tube of FIG. 1, while providing nonetheless for a controllable division of the output power between the required circuits. As shown, this embodiment is in the form of a single ended bridging type amplifier system or repeater, but two such systems may be connected back-to-back, if desired, and inserted in a transmission line in the same manner as illustrated in FIG. 1 when switches 34 and 35 are in dotted line position. The amplified output signal of this amplifier system may be divided equally or unequally in a predetermined ratio between two paths or circuits, the primary winding of the amplifier input transformer being common to both said circuits and novelly so connected therein that the output signal in one circuit may wholly or partially cancel the inductive effect of the other in said input transformer.

In the form shown in FIG. 2 the electronic amplifier tube 40 may be of the same type as the tubes 10 and 10′ illustrated in FIG. 1, but only half of the tube or a tube with a single set of elements will suffice as will also other known types of amplifier tubes, transistors, and other comparable devices. The cathode element 42 of the tube 40 is shown connected in the same manner as above described through a resistor 49 and a condenser 50 in shunt to the negative terminal of a source of direct current electric power, illustrated as a battery 48. The positive terminal of said source is connected to plate 41 of the tube through two series connected transformer windings 51 and 58. An isolation resistor 53 may be connected in the plate circuit when the power source is used to supply energy to other loads at the same time and a damping condenser 54 may be connected as shown to maintain the D.C. supply constant. Grid 44 of tube 40 is connected to the ungrounded terminal of the secondary winding 56 of a signal input transformer 55, 56, and a variable resistance 57 may be connected to the grid circuit in any known manner to function as a gain control. The bias on grid 44 is maintained normally negative by properly selecting the value of resistance 49 so that the tube 40 with maximum signal input cannot be driven to plate current cut-off.

The incoming signal circuit which may be connected across a two-wire line as shown or otherwise suitably coupled thereto, such as through a transformer, comprises primary winding 55 of the input transformer with a winding 59 connected in series therewith and coupled with winding 58. A resistance 60 may be connected in shunt with winding 59 and designed so as to permit a maximum input signal to reach winding 55 and to stabilize the impedance. Coupled with winding 51 through secondary winding 52 is a balancing circuit which may electrically duplicate or balance the load or incoming signal circuit. As shown, said balancing circuit comprises winding 52, input primary winding 55, a resistance 61 corresponding to resistance 60, and a resistance 62 or other load which may be adjusted to balance the corresponding load across the incoming signal circuit of which the transmission line 7 may be a part.

A signal is supplied to the input circuit by the two-wire transmission line, reaches primary winding 55 through winding 59 and resistance 60, and induces a corresponding signal in secondary winding 56, thus creating a varying bias on the grid 44 which correspondingly varies the conductivity of tube 40 and the energy flow in the plate circuit through windings 51 and 58. This variation in the plate or amplifier output circuit is, of course, substantially in phase with the incoming signal impressed upon the grid and results in the induction of amplified signals in the above-described balancing and incoming signal circuits through transformer windings 52 and 59, respectively, said output signals being substantially in phase with the input signal. The inductive effect, on the plate circuit of tube 40, of the portion of the input signal passing through winding 59 is negligible, if any. The portion of the relatively small input signal which traverses winding 59 will have only slight, if any, inductive effect in winding 58, resulting only in small voltage variations which will not cause any change in the plate circuit current.

The transformers 51, 52 and 58, 59 are preferably identical or nearly so, and the same are oppositely poled or so connected to winding 55 that the flow of amplified output energy induced in the input or incoming signal circuit through winding 59 will traverse winding 55 in one direction and the corresponding energy induced in the balancing circuit through winding 52 will traverse winding 55 in the opposite direction, as exemplified by the full line and dotted line arrows, respectively. The amplified output signals induced in the incoming signal and balancing circuits will thus cancel each other insofar as concerns any inductive effect in or feed-back to winding 56 without in any way disturbing the resultant effect of the incoming or input signal in the circuit which includes winding 55. The circuits including secondary windings 52 and 59 may also be regarded as output circuits in the sense that the amplifier output signals are induced therein and the circuit comprising winding 56 as the amplifier input circuit. It may also be considered that the voltage created by the divided output signals at opposite ends of winding 55 will be equal and thus create no effect in the transformer 55, 56. Just as in the embodiment of FIG. 1, however, the incoming signal through winding 55 may be complemented or partially cancelled, if desired, by suitably adjusting the circuit components so that the output signal returned to the input circuit is either greater or less than the output signal induced in the balancing circuit. This will result in a positive or negative feed-back as desired.

Instead of utilizing a voltage cancellation or balancing of the divided output signals through or across winding 55 to prevent or control feed-back to the amplifier grid circuit, such complete or partial cancellation may be accomplished magnetically or inductively with means illustrated in FIG. 3. In this modification of FIG. 2, the signal input and balancing circuits are completely isolated from each other, except that the same are inductively coupled through a separate winding 65 inductively coupled with winding 55. The windings are such that a signal flowing in one direction in winding 55 will magnetically or inductively cancel out the effects of an equal and oppositely directed signal in the winding 65. If the signal input and balancing circuits are not so constructed, or adjusted, that the amplifier output signals therein are equal and of opposite polarity in windings 55 and 65, there will, of course, result a controllable positive or negative feed-back, as the case may be, to the grid circuit through winding 56.

A further embodiment or modification of the invention is illustrated in FIG. 4 wherein the signal input is virtually completely isolated in a novel manner from the balancing circuit which effects cancellation of all or a controlled part of the feed-back of the output signal through the signal input circuit to the amplifier input or grid circuit. The cancellation in this instance takes place in the control grid circuit of an electronic tube or the comparable circuit of the amplifier which may, as in the other embodiments, be of any known type.

The specific circuitry illustrated in FIG. 4, by way of example, comprises a type 6AU6 electronic tube 69 having a cathode 70, a control grid 71 and a plate 72. The cathode is connected through ground to the negative terminal of the source of power, said connection including a resistance 73 in parallel with a condenser 74 to provide a normally negative bias on grid 71 so that the tube is normally at least slightly conductive. Grid 71 is connected to ground through series connected transformer windings 76 and 78. Plate 72 is connected as in FIG. 2 through series connected transformer windings 79 and 81 to the positive terminal of the power source. Coupled with winding 76 is a primary winding 75 which is connected in parallel with a winding 80 across a signal transmitting line 7, winding 80 being inductively coupled with winding 79 in the plate circuit of tube 69. The impedance of the plate circuit is so great for the input signal that substantially all of an input signal from line 7 is applied to the grid circuit through transformer 75, 76. That portion of the input signal which is transmitted through transformer 80, 79 has only an inappreciable effect in the plate circuit. Since there is no current flow in the grid circuit the signal voltage impressed thereon through input transformer 75, 76 has no effect upon transformer 77, 78 in the balancing circuit to be next described.

The balancing circuit in FIG. 4 is in effect a mirror image of the signal input circuit, except that the corresponding transformers 75, 76 and 77, 78 are oppositely poled to effect the desired balancing or cancellation of the feed-back effects of the output signals in a manner to be hereinafter described. An output transformer 81, 82 corresponds with transformer 79, 80 and a resistance 83 or other load corresponds with the load in the signal input circuit which is likewise an output signal circuit.

An incoming signal impressed across winding 75, and hence secondary winding 76 in the grid circuit, varies the conductivity of the tube 69 in a manner above described, and hence, the flow of current in the plate circuit from the power source. An amplified output signal substantially in phase with the input signal is thus induced into the signal input circuit through transformer 79, 80. A portion of this output signal traverses input winding 75 and hence, results in inductive feed-back to the grid circuit through winding 76. However, this inductive effect may be cancelled out or nullified by an equal and opposite effect resulting from a corresponding output signal induced into winding 82 and thence in winding 78 through winding 77. Since the windings 76 and 78 are oppositely poled, the feed-back signals therein will tend to cancel or balance each other. The output signals fed back to the windings 76 and 78, may, of course, be made unequal by controllably unbalancing the signal input and balancing circuits, thereby either complementing or reducing the effect of the incoming signal, depending upon the direction of the unbalance.

In each of the several systems above described, oscillation or so-called singing of the amplifier tube when the signal supply or input circuit is opened is obviated by the inherent functioning of the systems, thereby eliminating the need for any additional circuitry or components for the purpose. When the transmission line 7 and hence, the signal input circuit is opened, the input transformer is unbalanced. Accordingly, any amplifier output effects fed to the balancing circuit will impress a high negative feed-back into the grid circuit, thereby so affecting the grid bias as to obviate oscillation or so-called singing of the tube.

Similarly to the other embodiments, two units of the embodiment of FIG. 4 may also be connected back-to-back as repeater amplifiers in the manner shown in FIG. 1 to provide a two-way, two-wire communication system with the signals being amplified in the direction away from the originating signal in the line.

The several embodiments of the invention may be connected into the line in which a signal originates in many ways which will not be evident to skilled artisans. For example, instead of being connected across a two-wire line as illustrated in FIG. 2, the amplifier unit may be series connected in one side of the line or inductively coupled thereto. Also, any of the illustrated embodiments may be connected or inserted into an interrupted two-wire line rather than across an uninterrupted line. This may be accomplished by connecting the signal supply line wires at one side of the unit to what has been herein described as a signal input circuit of the unit through which the input signal is fed and comprising windings 55 and 59 in FIG. 2, for example, and connecting the line wires at the other side of the unit to the so-called balancing circuit, such as the circuit comprising windings 52 and 55 of FIG. 2. The load at opposite ends of the line should preferably be balanced either inherently or by suitable adjustment.

When it is desired to increase the amplification or gain beyond the capability of a single unit, two or more units may be connected to the line either in series or in parallel. When it is desired to add the amplification of two or more units, the signal input circuit of each unit is connected into one side of the two-wire transmission line. If desired, different units may be connected into or coupled to different wires of the transmission line at or near the same location or the same may be spaced at any desired intervals.

Units embodying the present invention are also readily adapted for uses involving wireless transmission, such as, for example, low power, short range radio communication. Radio repeater units embodying the novel amplification systems herein disclosed may be placed at intervals between the sending station and the ultimate receiver. These repeaters may be set up to receive through an aerial in the signal input circuit and to transmit or retransmit the amplified signals through the same aerial.

Although only a limited number of embodiments of the invention have been illustrated in the accompanying drawings and described in the foregoing specification, it is to be expressly understood that the invention is not limited thereto. Various changes may be made in the illustrated circuitry as well as in the components thereof without departing from the basic invention. The components of the system should be adapted to the frequencies to be handled. For example, high frequency coils with air cores should be used for radio frequencies in place of the iron core type diagrammatically illustrated for use with audio frequencies. The values of the various components of the several systems will vary in different units for different purposes and will be determined by many factors, including the gain desired, the frequencies and voltages involved, the desired gain characteristics in relation to frequencies and the like. The systems contemplated lend themselves to matching of the gain pattern to the incoming signal frequency to give maximum efficiency at all input signal frequencies which are expected to be handled. Systems contemplated by the invention are adapted for a multiplicity of uses not specifically mentioned, and many other changes may be made in the illustrated embodiments without departing from the spirit and scope of the invention as will now be apparent to those skilled in the art.

What is claimed is:

1. Electrical apparatus comprising an electronic valve comprising an anode and a control element, a first output transformer and a second output transformer, the primary windings thereof being connected in series in the anode circuit of said valve, a source of electrical energy for energizing said anode circuit, an input transformer having a secondary winding operably connected to the control element of said valve, an input circuit comprising the secondary winding of said first output transformer and the primary winding of said input transformer connected in series, and a balancing circuit comprising the secondary winding of the second output transformer and the primary winding of said input transformer connected in series, the secondary windings of said first and second output transformers being oppositely poled with respect to the primary winding of said input transformer, whereby the inductive effect in said input transformer of the energy supplied thereto by one of said output transformers may be wholly or partially nullified by the opposing inductive effect of energy supplied thereto from the other output transformer.

2. Electrical apparatus comprising a first output transformer and a second output transformer, the primary windings thereof being connected in series, a source of electrical energy for energizing a circuit comprising said primary windings, an input transformer, an input circuit comprising the secondary winding of said first output transformer and the primary winding of said input transformer connected in series, a balancing circuit comprising the secondary winding of the second output transformer and the primary winding of said input transformer connected in series, the secondary windings of said first and second output transformers being oppositely poled with respect to the primary winding of said input transformer, whereby the inductive effect in said input transformer of energy supplied thereto by one of said output transformers may be at least partially nullified by the opposing inductive effect of energy supplied thereto from the other output transformer, and means connected in series circuit with the primary windings of said output transformers and operably connected to the secondary winding of said input transformer, said last-named means being responsive to the voltage induced across the secondary winding of said input transformer for varying the magnitude of the current flowing through the primary windings of said output transformers.

3. Electrical apparatus as defined in claim 1 comprising an additional source for supplying electrical current of varying magnitude to the primary winding of said input transformer.

4. Electrical apparatus comprising a first output transformer and a second output transformer, the primary windings thereof being connected in series, a source of electrical energy for energizing a circuit comprising said primary windings, an input transformer, an input circuit comprising the secondary winding of said first output transformer and the primary winding of said input transformer connected in series, a balancing circuit comprising the secondary winding of the second output transformer and the primary winding of said input transformer connected in series, the secondary windings of said first and second output transformers being oppositely poled with respect to the primary winding of said input transformer, whereby the inductive effect in said input transformer of energy supplied thereto by one of said output transformers may be at least partially nullified by the opposing inductive effect of energy supplied thereto from the other output transformer, a source for supplying electrical current of varying magnitude to the primary winding of said input transformer, and means operably connected in circuit with said series-connected primary windings and to the secondary winding of said input transformer and responsive to the electrical energy induced into the secondary winding of said input transformer for controlling the magnitude of the current flowing from said first-named source through the primary windings of said output transformers.

5. Electrical apparatus comprising a source of direct current electrical energy, an electronic valve, a pair of output transformers having the primary windings thereof connected in series with each other and said valve in circuit with said source, an input transformer having a secondary winding operatively connected to the control element of said valve, an input circuit comprising the primary winding of said input transformer and the secondary winding of one of said output transformers connected in series, a balancing circuit comprising the primary wind- of said input transformer and the secondary winding of the other of said output transformers connected in series, the primary winding of said input transformer having opposite polarities in said input and balancing circuits, and a source of variable current connected to the primary winding of said input transformer.

6. Electrical apparatus as defined in claim 5 wherein said source of variable current is connected to said primary winding of the input transformer through said input circuit.

7. Electrical apparatus as defined in claim 5 comprising a resistance connected in shunt with each of the secondary windings of said output transformers.

8. Electrical apparatus as defined in claim 5 wherein said primary winding of the input transformer comprises two separate coils, one of said coils being connected in said input circuit and the other of said coils being connected in the balancing circuit and being of opposite polarity.

9. Electrical apparatus comprising a source of direct current electrical energy, a pair of output transformers having the primary windings thereof connected in series to said source, an input transformer, an input circuit comprising the secondary winding of one of said output transformers and the primary winding of said input transformer connected in series, a balancing circuit comprising the secondary winding of the other of said output transformers and the primary winding of said input transformer, said primary winding of the input transformer having opposite polarities in said input and balancing circuits, means for supplying a variable electrical current through said input circuit to the primary winding of said input transformer for inducing a variable voltage across the secondary winding of said input transformer, and means responsive to said induced voltage for varying the flow of current through the primary windings of said output transformers.

10. Electrical apparatus as defined in claim 9 wherein the primary windings of said output transformers are connected in circuit with said source through an electronic valve, the conductivity of which is varied in accordance with the voltage induced across the secondary winding of said input transformer.

11. Electrical apparatus as defined in claim 10 wherein the secondary winding of the input transformer is operably connected to the control element of said valve to vary the voltage bias of said element in said valve.

12. Electrical apparatus comprising a source of direct current electrical energy, an electronic valve, a pair of output transformers having primary windings connected in series with each other and said valve in circuit with said source, an input transformer having two primary windings and a secondary winding, means connecting said secondary winding to the control element of said valve, means connecting one of said two primary windings in series circuit with the secondary winding of one of said output transformers, means connecting the other of said two primary windings in series circuit with the secondary winding of the other output transformer, the polarities of said two primary windings of the input transformer being reversed with respect to each other, and a source of variable electrical current for one of the primary windings of said input transformer.

13. Electrical apparatus comprising a pair of output transformers, the primary windings thereof being connected in series, a source of electrical energy for energizing a circuit comprising said primary windings, an input transformer having a secondary winding and two primary windings, a load circuit comprising the secondary winding of one of said output transformers and a primary winding of said input transformer connected in series, a balancing circuit comprising the secondary winding of the other of said output transformers and the other primary winding of said input transformer connected in series, the polarities of said primary windings of the input transformer being reversed with respect to each other, means for supplying a variable electrical current to one of the primary windings of said input transformer through said input circuit, and means responsive to the variable voltage induced into the secondary winding of said input transformer for varying the magnitude of the current flowing through the primary windings of the said output transformers.

14. In electrical apparatus a source of electrical energy, a first output transformer having a primary winding connected to said source, an input transformer, an input circuit comprising the secondary winding of said output transformer and the primary winding of said input transformer, means for supplying a variable electrical current to the primary winding of said input transformer through said input circuit to induce a variable voltage across the secondary winding of said input transformer, means responsive to said induced variable voltage for varying the current flow through the primary winding of said output transformer, and means comprising a second output transformer without inductive coupling to said first output transformer for at least in part nullifying the inductive effect in the input transformer of the energy induced into the input circuit through the secondary winding of said first output transformer.

15. Electrical apparatus as defined in claim 14 wherein the secondary winding of the first output transformer and the primary winding of the input transformer are connected in series in said input circuit.

16. Electrical apparatus as defined in claim 14 wherein the secondary winding of the first output transformer and the primary winding of the input transformer are connected in parallel in the input circuit.

17. Electrical apparatus as defined in claim 14 wherein said second output transformer has a primary winding connected in series with the primary winding of said first output transformer, and said nullifying means includes a balancing circuit comprising the secondary winding of said second output transformer and an inductive winding operatively coupled to the circuit which includes the secondary winding of the input transformer.

18. Electrical apparatus as defined in claim 17 wherein said inductive winding is the primary winding of the input transformer and the polarity thereof with respect to the input circuit is opposed to the polarity thereof with respect to the balancing circuit.

19. Electrical apparatus as defined in claim 17 wherein said inductive winding is inductively coupled with the primary and secondary windings of said input transformer and the polarity thereof is opposed to the polarity of the primary winding of said input transformer.

20. Electrical apparatus as defined in claim 17 wherein said inductive winding is inductively coupled to the circuit containing the secondary winding of the input transformer independently of said last-named secondary winding.

21. Electrical apparatus as defined in claim 20 wherein said inductive winding in the balancing circuit and the secondary winding of said second output transformer are connected in parallel in the balancing circuit.

22. Electrical apparatus as defined in claim 17 wherein said inductive winding and the secondary winding of the second output transformer are connected in series in the balancing circuit.

23. In electrical apparatus, a source of electrical energy, an output circuit comprising electronic valve means connected to said source, an input transformer, a signal input circuit for supplying pulsating electrical current to the primary winding of said transformer to induce a variable voltage across the secondary winding of said transformer, means connecting said secondary winding to the control means of said valve means to vary the conductivity of the latter in response to the voltage variations across said secondary winding, means for coupling said output circuit to said signal input circuit, a balancing circuit, and means for coupling said output circuit to said balancing circuit, both said coupling means being of a type to transmit the pulsating component of electrical energy from said output circuit to said signal input and balancing circuits, the primary winding of said input transformer being so associated with said balancing circuit and said signal input circuit that the inductive effect on the input transformer of the output energy transmitted to said signal input circuit is at least partially balanced and nullified by the opposing effects on said input transformer of the output energy transmitted to said balancing circuit, said first-named coupling means and said second-named coupling means being ineffective to operatively couple said signal input circuit and said balancing circuit with respect to signals introduced through said signal input circuit whereby said signals are applied across said primary winding without appreciable loss by cancellation through said balancing circuit.

24. Electrical apparatus as defined in claim 23 wherein said coupling means comprise an inductive coupling between said output circuit and each of said signal input circuit and said balancing circuit.

25. Electrical apparatus as defined in claim 23 wherein said coupling means comprise a capacitative coupling between said output circuit and each of said signal input and balancing circuits.

26. Electrical apparatus as defined in claim 25 wherein the primary winding of said input transformer is connected between the output terminals of said capacitative couplings.

27. Electrical apparatus as defined in claim 23 wherein said electronic valve means comprises two electronic valves connected in parallel branches of said output circuit, one of said branches being coupled to the signal input circuit and the other said branch being coupled to said balancing circuit.

28. Electrical apparatus as defined in claim 27 wherein the control elements of said electronic valves are connected in parallel and to the secondary winding of the input tranformer.

29. Electrical apparatus comprising amplifier means, a signal input circuit coupled to the input of said amplifier means, means coupling the output circuit of said amplifier means to said input circuit, and means energized from the output circuit of said amplifier means for controllably cancelling out the feed-back effect of the amplified output signal in the signal input circuit, said coupling and cancelling means comprising inductively segregated transformers having the primary windings thereof in the output circuit of said amplifier means.

30. Electrical apparatus comprising amplifier means, a balancing circuit, a signal input circuit coupled to the input of said amplifier means for controlling the output signal of said amplifier means, and means coupling the output of said amplifier means to said signal input circuit and to said balancing circuit, the coupling to said signal input circuit being substantially inductively segregated from the coupling to said balancing circuit and the latter being coupled to the input of the amplifier means to control the feed-back of the output signal from one of said circuits to the input of said amplifier means.

31. In electrical apparatus, amplifier means comprising signal input circuit means and amplified signal output means including a source of electrical energy, a signal input circuit, a balancing circuit, means for generating an input signal in said signal input circuit, input coupling means for coupling said signal input circuit and said balancing circuit to said input circuit means, inductively segregated output coupling means for coupling said signal output means to said signal input circuit and to said balancing circuit, said coupling means being such that signals transmitted to said signal input circuit and to said balancing circuit from said signal output means tend to balance each other across said input coupling means and said coupling means being ineffective to permit feed-back of said input signal therethrough to said signal input circuit.

32. In electrical apparatus, amplifier means comprising electronic valve means, input circuit means connected to the control grid of said valve means, a source of electrical energy and an output circuit comprising said source and the anode and cathode elements of said valve means, a signal input circuit, a balancing circuit, means for generating an input signal in said signal input circuit, input coupling means for coupling said signal input circuit and said balancing circuit to said input circuit means, output coupling means for coupling said output circuit to said signal input circuit and said balancing circuit, said coupling means being such that signals transmitted to said signal input circuit and said balancing circuit from said output circuit oppose each other in said input coupling means, and said output coupling means being ineffective to permit feed-back of said input signal therethrough to said signal input circuit.

33. Electrical apparatus comprising amplifier means having output circuit means wherein current flow is not appreciably affected by voltage changes and input circuit means associated with said output circuit means whereby current flow in the latter is controlled by voltage variations in said input circuit means, a signal input circuit, a balancing circuit, means for generating a variable input signal in said signal input circuit, means for coupling each of said circuits to said output circuit means and to said input circuit means whereby said input signal is effective to vary the voltage in said input circuit means, said coupling means and said circuit means being such that said input signal is transmitted to said input circuit means without any feedback of said input signal through said coupling means and circuit means to said signal input circuit.

34. Electrical apparatus as defined in claim 33 wherein said coupling means are such that signals transmitted to one of said circuits from said output circuit means at least partially balances out the effect on the input circuit means of the signal transmitted to the other of said circuits from said output circuit means.

35. Electrical apparatus comprising amplifier means having input circuit means and output circuit means, two external circuits, means coupling each of said external circuits to said output circuit means and to said input circuit means, said coupling means being responsive to pulsating signals only, means for generating in one of said external circuits a pulsating input signal, said coupling means and circuit means being such that said input signal is transmitted to said input circuit means without appreciable detrimental feedback of said input signal through said coupling means and circuit means to said one external circuit, and said coupling means further being such that signals transmitted to one of said external circuits from said output circuit means at least partially balances out the effect on the input circuit means of the signal transmitted to the other of said external circuits from said output circuit means.

36. Electrical apparatus comprising amplifier means having an input circuit and an output circuit, a signal input circuit, a balancing circuit, a transformer comprising a secondary winding in said first-named input circuit and a primary winding operably connected with said signal input circuit, means for coupling said output circuit to said signal input circuit, means inductively segregated from said last-named coupling means for coupling said output circuit to said balancing circuit without permitting feed-back therethrough of signals impressed upon the signal input circuit, and means including said primary winding for operably connecting said signal input circuit and said balancing circuit so that the effect, on said first-named input circuit, of signals transmitted to the balancing circuit from the output circuit will oppose the effect, on said first-named input circuit, of the signals transmitted from the output circuit to the signal input circuit.

37. In electrical apparatus a source of electrical energy, first and second devices, each comprising an output circuit including electronic valve means connected to said source, an input transformer, a signal input circuit for supplying pulsating electrical current to the primary winding of said transformer to induce a variable voltage across the secondary winding of said transformer, means for coupling said output circuit to said signal input circuit, a balancing circuit and means for coupling said output circuit to said balancing circuit, both said coupling means being of a type to transmit the pulsating component of electrical energy from said output circuit to said signal input and balancing circuits, the primary winding of said input transformer being so associated with said balancing circuit and said signal input circuit that the inductive effect on the input transformer of the output energy transmitted to said signal input circuit is at least partially balanced and nullified by the opposing effects on said input transformer of the output energy transmitted to said balancing circuit, said first-named coupling means and said second-named coupling means being ineffective to operably couple said signal input circuit and said balancing circuit with respect to signals introduced through said signal input circuit, whereby said signals are applied across said primary winding without appreciable loss by cancellation through said balancing circuit, means connecting said secondary winding of said first device to the control means of the electronic valve means of said second device to vary the conductivity of said valve means in response to voltage variations across said secondary winding, and means connecting said secondary winding of said second device to the control means of the electronic valve means of said first device to vary the conductivity of said last-named valve means in response to voltage variations across said last-named secondary winding.

38. Electrical apparatus comprising amplifier means, a signal input circuit coupled to the input of said amplifier means, means coupling the output circuit of said amplifier means to said signal input circuit to transmit the amplified output signal to the latter without appreciably affecting the amplitude of signals introduced through said signal input circuit and impressed upon the input of said amplifier means, and means for controlling the feed-back of said output signal to the input of said amplifier means comprising a balancing circuit coupled to said amplifier output circuit and coupled to said input of the amplifier means, the couplings being such that the output signal transmitted to the balancing circuit bucks the output signal transmitted to the signal input circuit.

39. The method of controlling signal gain in a transmission line adapted for transmitting electrical signals in two directions which comprises energizing the output circuit of an amplifier to cause current to flow therein, inductively feeding an electrical information signal into the input of the amplifier from said line to vary the current flow in said output circuit and create an amplified signal therein, inductively feeding the amplified signal from the output circuit of said amplifier into said line and into the input of the amplifier as positive feed-back while inductively impressing a voltage upon said output circuit as a result of said information signal in the transmission line, maintaining the current flow in said output circuit substantially independent of voltage impressed thereon by said information signal, and utilizing amplified signal energy from the output circuit of said amplifier as negative feed-back to controllably cancel out the said positive feed-back of the amplified signal to the input of the amplifier.

40. Electrical apparatus comprising amplifier means, a transmission line for transmitting electrical information signals in two directions, means for inductively coupling said transmission line to the input of said amplifier means to impress an information signal from said line upon the input of the amplifier means, first output means for impressing an amplified output signal from said amplifier means upon said transmission line and said coupling means in substantially superimposed, in-phase relation with said information signal, a balancing load circuit, and second output means for feeding an amplified output signal from said amplifier means into said balancing circuit and said coupling means for at least partially cancelling the feed-back of said first-named output signal through said coupling means to the input of said amplifier means.

41. Electrical apparatus comprising amplifier means, a transmission line for transmitting electrical information signals in two directions inductively coupled to the input circuit of said amplifier means, first output means coupling the output circuit of said amplifier means to said transmission line and to said input circuit of the amplifier means to transmit an amplified signal to said line and said input circuit, a balancing load circuit, and second output means for feeding an amplified signal from the output circuit of said amplifier means to said balancing circuit and to said input circuit of the amplifier means for controlling the feed-back of said first-named output signal to the input circuit of said amplifier means.

References Cited in the file of this patent

UNITED STATES PATENTS

| | | |
|---|---|---|
| 1,863,566 | Dolmage | June 21, 1932 |
| 1,895,808 | Lowe | Jan. 31, 1933 |
| 2,046,119 | Harding | June 30, 1936 |
| 2,463,379 | Harding | Mar. 1, 1949 |
| 2,756,282 | Douma | July 24, 1956 |
| 2,792,553 | Moulon | May 14, 1957 |
| 2,843,671 | Wilkins et al. | July 15, 1958 |